United States Patent
Ho et al.

(10) Patent No.: US 9,243,340 B2
(45) Date of Patent: Jan. 26, 2016

(54) NON-VACUUM METHOD OF MANUFACTURING LIGHT-ABSORBING MATERIALS FOR SOLAR CELL APPLICATION

(71) Applicant: Nano and Advanced Materials Institute Limited, Hong Kong (HK)

(72) Inventors: Kam Piu Ho, HK (HK); Paul Kwok Keung Ho, HK (HK); Man Wah Liu, HK (HK); Ranshi Wang, HK (HK); Wai Chun Luk, HK (HK); Wing Ho Choi, HK (HK); Fulin Zheng, HK (HK); Kwong Chau Kwok, HK (HK); Mei Mei Hsu, HK (HK); Ivan Ka Yu Lau, HK (HK)

(73) Assignee: NANO AND ADVANCED MATERIALS INSTITUTE LIMITED, Hong Kong (HK)

( * ) Notice: Subject to any disclaimer, the term of this patent is extended or adjusted under 35 U.S.C. 154(b) by 0 days.

(21) Appl. No.: 14/178,308

(22) Filed: Feb. 12, 2014

(65) Prior Publication Data
US 2014/0251435 A1    Sep. 11, 2014

Related U.S. Application Data

(60) Provisional application No. 61/851,407, filed on Mar. 7, 2013.

(51) Int. Cl.
 *C25D 3/54* (2006.01)
 *C25D 3/56* (2006.01)
 (Continued)

(52) U.S. Cl.
 CPC .. *C25D 3/30* (2013.01); *C25D 3/22* (2013.01); *C25D 3/38* (2013.01); *C25D 3/54* (2013.01);
 (Continued)

(58) Field of Classification Search
 CPC ............................. C25D 3/54; H01L 31/0326
 See application file for complete search history.

(56) References Cited

U.S. PATENT DOCUMENTS 5,118,394 A * 6/1992 Makino et al. ................ 205/253
6,508,927 B2 * 1/2003 Yanada et al. ................ 205/241
(Continued)

FOREIGN PATENT DOCUMENTS

CN       102251235 A       11/2011

OTHER PUBLICATIONS

"Preparation of Cu2ZnSnS4 Thin Films by Sulfurization of Co-Electroplated Cu-Zn-Sn Precursors" by Araki et al., Phys. Status Solidi C 6(5), pp. 1266-1268 (2009).*
(Continued)

*Primary Examiner* — Bryan D. Ripa
(74) *Attorney, Agent, or Firm* — Ella Cheong Hong Kong; Sam T. Yip (57) ABSTRACT

The present invention describes a method of producing a p-type light-absorbing semiconductor copper zinc tin selenide/sulfide $(Cu_2(Zn_xSn_{2-x})(S_ySe_{1-y})_4)$ (abbreviated CZTS) with electrochemical deposition. It can be used in the production of solar cell when combined with an n-type inorganic or an organic semiconductor layer. The present method comprises a one-step or a sequence of depositions using electroplating to fabricate a low-cost and large-area CZTS solar cell, without using expensive and complicated deposition techniques or highly toxic and flammable chemicals in the production process. The present method significantly reduces the cost and energy requirement for production of solar cell.

9 Claims, 8 Drawing Sheets

(51) Int. Cl.

| | | |
|---|---|---|
| H01L 31/18 | (2006.01) | |
| C25D 3/30 | (2006.01) | |
| H01L 31/032 | (2006.01) | |
| C25D 3/22 | (2006.01) | |
| C25D 3/38 | (2006.01) | |
| C25D 3/58 | (2006.01) | |
| C25D 3/60 | (2006.01) | |
| C25D 5/10 | (2006.01) | |
| C25D 5/50 | (2006.01) | |

(52) U.S. Cl.
CPC .............. *C25D 3/565* (2013.01); *C25D 3/58* (2013.01); *C25D 3/60* (2013.01); *C25D 5/10* (2013.01); *C25D 5/50* (2013.01); *C25D 5/505* (2013.01); *H01L 31/0326* (2013.01); *Y02E 10/50* (2013.01)

(56) References Cited

U.S. PATENT DOCUMENTS

| | | | |
|---|---|---|---|
| 6,974,767 B1 * | 12/2005 | Lopatin | 438/625 |
| 2002/0063063 A1 * | 5/2002 | Uchida et al. | 205/247 |
| 2012/0061250 A1 | 3/2012 | Ahmed et al. | |
| 2012/0061790 A1 | 3/2012 | Ahmed et al. | |

OTHER PUBLICATIONS

Hongxia Wang, "Progress in Thin Film Solar Cells Based on Cu2ZnSnS4", J. Photoenergy, 2011, 2011, Article ID. 801292.
Katagiri et al., "Development of CZTS-based thin film solar cells", Thin Solid Films, 2009, 517, 2455-2460.
Wang et al., "Thermally evaporated Cu2ZnSnS4 solar cells", Appl. Phys. Lett., 2010, 97, 143508.
Shin et al., "Thin film solar cell with 8.4% power conversion efficiency using an earth-abundant Cu2ZnSnS4 absorber", Prog. Photovolt: Res. Appl., 2011, DOI: 10.1002, 1174.
Barkhouse et al., "Device characteristics of a 10.1% hydrazine-processed Cu2ZnSn(Se,S)4 solar cell", Prog. Photovoltaics: Res. Appl. 2011, DOI: 10.1002/ pip.1160.
Ennaoui et al., "Cu2ZnSnS4 thin film solar cells from electroplated precursors: Novel low-cost perspective", Thin Solid Films, 2009, 517, 2511-2514.
Scragg et al., "A 3.2% efficient Kesterite device from electrodeposited stacked elemental layers", J. Electroanal. Chem., 2010, 646, 52-59.
Ahmed et al., "A High Efficiency Electrodeposited Cu2ZnSnS4 Solar Cell", Advanced Energy Materials, 2(2), 253-259, Feb. 2012.
Guo et al., "Fabrication of 7.2% Efficient CZTSSe Solar Cells Using CZTS Nanocrystals", J. Am. Chem. Soc., 2011, 132, 17384-17386.

* cited by examiner

FIG. 1

| Element | Atomic % |
|---|---|
| Cu | 25.02 |
| Zn | 13.51 |
| Sn | 12.16 |
| S | 28.69 |
| Se | 20.62 |
| Total | 100.00 |
| Cu/(Zn+Sn) | 0.97 |
| Zn/Sn | 1.11 |
| Metal/(S+Se) | 1.03 |

NON-VACUUM METHOD OF MANUFACTURING LIGHT-ABSORBING MATERIALS FOR SOLAR CELL APPLICATION

CROSS-REFERENCE TO RELATED APPLICATIONS

The present application claims priority from the U.S. provisional application Ser. No. 61/851,407 filed Mar. 7, 2013, and the disclosure of which is incorporated herein by reference in its entirety.

FIELD OF THE INVENTION

The present invention relates to a method of producing light-absorbing materials useful for solar cell. In particular, the present invention provides a method of producing a p-type light-absorbing semiconductor based on copper zinc tin selenide/sulfide ($Cu_2(Zn_xSn_{2-x})(S_ySe_{1-y})_4$) (abbreviated "CZTS") by using electrochemical deposition, which can be used in the production of solar cell when combined with an n-type inorganic or an organic semiconductor layer. The present invention also relates to a light-absorbing semiconductor prepared by the method of the present invention.

BACKGROUND OF THE INVENTION a-Si, CdTe and CIGS solar cells are being investigated worldwide as new generation thin-film solar cells to succeed c-Si solar cells. Among them, the CIGS solar cell has established itself as a leader of next generation solar cells because of its high optical absorption coefficient and cell efficiency. However, the supply of the rare earth metal indium for the CIGS production can be a problem in the near future. Consequently, lots of researches have recently been focused on the development of indium-free solar cells. CZTS quaternary semiconductor compound is an ideal candidate for use in thin-film solar cells as all the constituent elements are earth abundant and environmentally benign.

Various synthesis techniques have been developed for the preparation of the light-absorbing layer (*J. Photoenergy*, 2011, 2011, Article ID. 801292). Katagiri et al. reported a sulfur-based CZTS solar cell with conversion efficiency of 6.75% (0.15 cm$^2$) started from sputtered precursor layers of Cu, ZnS, and SnS and followed by in-line sulfurization for 3 h at 580° C. (*Thin Solid Films*, 2009, 517, 2455). By thermal co-evaporation, Wang et al. and Shing et al. described a method to prepare sulfur-based CZTS solar cells with conversion efficiencies of 6.8% (0.45 cm$^2$) and 8.4% respectively after anealing at around 500° C. (*Appl. Phys. Lett.*, 2010, 97, 143508 and *Prog. Photovolt: Res. Appl.*, 2011, DOI: 10.1002, 1174). For the $Cu_2ZnSn(S,Se)_4$, Agrawal et al. (Purdue University) reported the fabrication of a solar cell using $Cu_2ZnSn(S,Se)_4$ nanocrystals via a robust film coating method with 7.2% (0.47 cm$^2$) of conversion efficiency (*J. Am. Chem. Soc.*, 2011, 132, 17384). 10.1% conversion efficiency of a 0.44 cm$^2$ $Cu_2ZnSn(S,Se)_4$ solar cell has been obtained from a hydrazine-based solvothermal method reported by Barkhouse et al. from IBM (*Prog. Photovoltaics: Res. Appl.* 2011, DOI: 10.1002/pip. 1160). They suggested that the addition of selenium to the absorber layer results in a lower bandgap, where ultimately help to get a high current density. For the methods described above, either expensive deposition techniques (e.g. evaporation and sputtering) or highly toxic and flammable chemicals (e.g. hydrazine) are used in the fabrication processes. In industrial scale production, the use of high-temperature and high-vacuum equipment will increase the cost as well as the energy consumption. Besides, the use of large amount of toxic chemicals is detrimental to the environment.

Electrochemical deposition is one of the low-cost and simple processes to deposit a CZTS layer on a substrate. This method does not use toxic chemical. The electrolytic bath can be reused for a long period of time. Electrochemical depositions of copper, zinc and tin are done at a relatively low temperature, which does not require large amount of energy, as opposed to high temperature and high vacuum evaporation and sputtering techniques. There are few research groups working on electro-synthesis of CZTS thin films for solar cell application and none of them uses the current invention to prepare electroplated CZTS light-absorbing layer. Ennaoui et al. (Helmholtz-Zentrum Berlin für Materialien und Energie GmbH) reported the preparation of a $Cu_2ZnSnSe_4$ layer using $H_2Se$ as the Se sources in the annealing process (*Thin Solid Films*, 2009, 517, 2511). However, the use of highly toxic $H_2Se$ gas in CZTS manufacturing process is generally not recommended in large scale production purpose. Scragg et al. (University of Bath) reported the preparation of a $Cu_2ZnSnS_4$ layer using sulfur vapor as the sulfur sources under vacuum conditions in the annealing process (*J. Electroanal. Chem.*, 2010, 646, 52). However, the method is designed only for a small substrate, and cannot be directly scaled up as a complicated sealing and annealing process under controlled-vacuum conditions is needed. In the above reports, they all carried out their studies on a small substrate, and they did not deposit Se and/or S layer using electroplating method. Therefore, a simple, low-cost, less toxic, and safer process for manufacturing large-area CZTS solar cell is therefore needed.

In US patent application publication number US20120061790A1, a p-type CZTS absorber was formed by using electrodeposition. One of the embodiments in '790 disclosed a copper zinc selenium (Cu—Zn—Se) alloy stack which was electrodeposited on a substrate in a plating bath, followed by electroplating a Sn layer. The Se annealing step was conducted at a temperature of from about 80° C. to about 100° C. for duration of about 30 minutes to about 60 minutes. However, this method involved an additional annealing step, i.e., in addition to the soft anneal and the final anneal, after the Se layer was plated onto the stack. The as-plated Se layer was amorphous and resistive and thus required an additional Se annealing step to make the layer crystalline and conductive. After that, the metal-semiconductor alloy stack was subjected to an intermediate/soft anneal which helped form the copper zinc selenium tin (Cu—Zn—Se—Sn) alloy followed by a final anneal in a S environment (to produce CZTS in the form of $Cu_2ZnSn(S/Se)_4$). A soft anneal was required to avoid formation of unwanted secondary phase, for example $Cu_2(S/Se)Cu_{2-x}(S/Se)$, $Sn(S/Se)_2$, $Sn_2(S/Se)_3$, $Cu_2Sn(S/Se)_3$, $Zn(S/Se)$, etc. with single phase polycrystalline CZTS which eventually cause adverse effects on the efficiency of the cell. The problems of the method disclosed in '790 include: selenization requires long time during the disclosed Se annealing step; selenium attacks the substrate and causes an increase in surface roughness during long-time selenization. Also, an additional soft annealing step is required in '790. To solve these problems, the present invention provides a method which does not require long time in selenization and can avoid selenium attack to the substrate.

SUMMARY OF THE INVENTION

Disclosed in the present invention is a method of preparing a CZTS-based light absorbing semiconductor for solar cell application. Not only the fabrication of the light absorption layers can be simplified in the manufacturing process, scale up into large substrate with good conversion efficiency can be easily achieved due to ease of control of film thickness and uniformity.

The present invention provides a method of preparing a light-absorbing semiconductor with a general formula of $Cu_2(Zn_xSn_{2-x})(S_ySe_{1-y})_4$ by using electrochemical method. The CZTS-based semiconductor prepared by the method of the present invention can be used in the production of solar cells when combined with an n-type inorganic or an organic semiconductor layer.

The method of the present invention includes using at least two solvent systems. The first solvent system containing mainly salts of citrate and ionic compounds of copper, zinc and tin is used for Cu—Zn—Sn alloy or Cu/Zn/Sn metal stack plating. The second solvent system containing mainly a selenium compound, tetra-alkyl-quaternary ammonium salts and polar solvents is used for selenium plating. The method does not require additional equipment and techniques for metal deposition (e.g. metal sputtering, and selenium thermal deposition) or highly toxic and flammable chemicals (e.g. hydrazine) for the subsequent processes.

The method of the present invention is size-scalable because it uses electroplating method, whereby the deposition thickness and uniformity of the resulting CZTS film can be controlled by electric current density and current density distribution. These advantages pave the way towards achieving high efficiency for solar energy conversion at very low production cost.

In a first aspect of the present invention, the method of preparing a CZTS-based semiconductor first involves formation of a thin film of Cu—Zn—Sn alloy and Cu/Zn/Sn metal stack on a conductive substrate including the steps of:

a) Forming the first solvent system comprising mainly salts of citrate and ionic compounds of copper, zinc and tin;
b) Adding one or more of electrochemical additives to the first solvent system, such as brightener, leveler, suppressor, throwing agent, conducting salt and other additives, to control the current density distribution of the deposition of copper, zinc and tin;
c) Mixing all the ingredients well to form a bath for electrochemical deposition;
d) Two options to formulate a bath formulation: For layer-by-layer deposition, individual baths of copper, zinc and tin are used; for co-deposition, more than one ionic compounds of copper, zinc and tin with their corresponding additives are prepared in a single bath;
e) Providing either the bath formulation to a plating tank with all the necessary hardware including anode and cathode or performing steps a) to c) in a plating tank with all the necessary hardware;
f) Controlling the current density and potential with a rectifier; the bath temperature with heat exchanger and cooler; and circulating the bath with a circulation pump and filter;
g) Immersing the conductive substrate into the electrochemical bath;
h) Electrically connecting the conductive substrate to cathode and connecting a counter electrode including platinum, titanium or graphite to anode;
i) Electrochemically depositing film comprising copper, zinc and tin either by layer-by-layer or by co-deposition;
j) Annealing each of the electroplated layers on the conductive substrate at a temperature of 300° C. to 600° C. for 2 to 60 minutes under sulfur- and/or selenium-containing atmosphere and oxygen-free environment to form the crystalline CZTS compound. A carrier gas (e.g. argon and nitrogen) is used to create a sulfur- and/or selenium-rich atmosphere through flowing over the corresponding elemental sulfur and selenium powders.

In an exemplary embodiment, a Cu—Zn—Sn alloy formed by co-plating is preferred, rather than a Cu/Zn/Sn metal stack formed by layer-by-layer. Sequential annealing under (i) sulfur-containing condition followed by (ii) selenium-containing condition on the Cu—Zn—Sn alloy or Cu/Zn/Sn metal stack is preferred, rather than in reverse order or simultaneous annealing. However, if needed, the order of annealing under sulfur and selenium-containing conditions can be reversed. Also, electroplating a selenium layer on a sulfurized Cu—Zn—Sn alloy or Cu/Zn/Sn metal stack is preferred, rather than solely using a carrier gas flowing over elemental selenium to create a selenium-rich atmosphere for selenium annealing. The second solvent system for selenium electroplating comprises mainly selenium compounds, tetra-alkyl-quaternary ammonium salt and a polar solvent.

In the second aspect of the present invention, different bath formulation for depositing different combination of layers on a conductive substrate to form metal stack or alloy are provided for the purpose of preparing an efficient light-absorbing material for solar cell. Details of different bath formulations are provided in the examples of the present application.

DETAILED DESCRIPTION OF THE INVENTION

The present invention describes a method of preparing a p-type light-absorbing semiconductor, CZTS film, on a conductive substrate by electrochemical process. The CZTS film is prepared by an electrodeposition-annealing route. The precursors (Cu, Zn, Sn and Se) can be electroplated on a conducting substrate (e.g. Molybdenum, glass, plastic, stainless steel and aluminum) using the bath formulation described in the present invention. In the following examples, molybdenum is chosen as the conductive substrate for illustration purpose.

Figure 1:
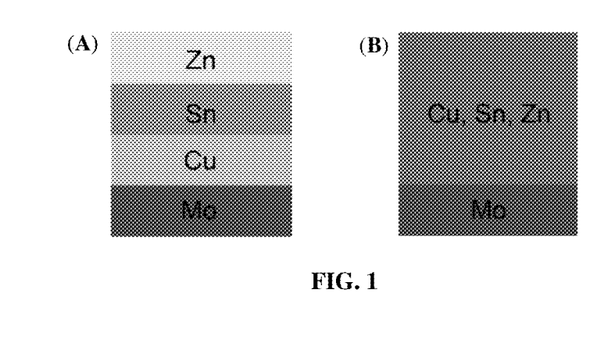
FIG. 1 shows schematic diagrams of (A) a sequentially electroplated Cu/Zn/Sn metal stack and (B) co-electroplated Cu—Zn—Sn alloy.

The CZTS constituent species with optimal stoichiometric ratio of copper, zinc and tin are obtained from the bath formulations described in the present invention. The bath formulations containing copper, zinc, and tin are used to electroplate Cu/Zn/Sn metal stack or Cu—Zn—Sn alloy on a conductive substrate (FIG. 1). According to an exemplary embodiment of the present invention, Cu—Zn—Sn alloy formed by co-plating is preferred. Cu—Zn—Sn alloy is first formed in a single bath followed by annealing the electroplated layers.

In the present invention, it is preferable to use a controlled current from about 0.3 mA/cm$^2$ to about 1 mA/cm$^2$ for depositing Cu—Zn—Sn alloy or Cu/Zn/Sn metal stack. The bath formulation is heated to a temperature which preferably ranges from 20° C. to 60° C. In all cases, the bath temperature should be kept constant during the deposition.

Sulfur-rich and selenium-rich atmosphere is created to sequentially anneal Cu—Zn—Sn alloy or Cu/Zn/Sn stack to form CZTS compound. In the present invention, electrodepositing a selenium layer before annealing is preferred, rather than solely using a carrier gas flowing over selenium to create a selenium-rich atmosphere for annealing.

According to an exemplary embodiment of the present invention, it is preferable to use a controlled current from about 3 mA/cm$^2$ to about 10 mA/cm$^2$ for the deposition of a selenium layer. The bath formulation is heated to a temperature which preferably ranges from 60° C. to 120° C. In all cases, the bath temperature should be kept constant during the deposition.

Figure 2:
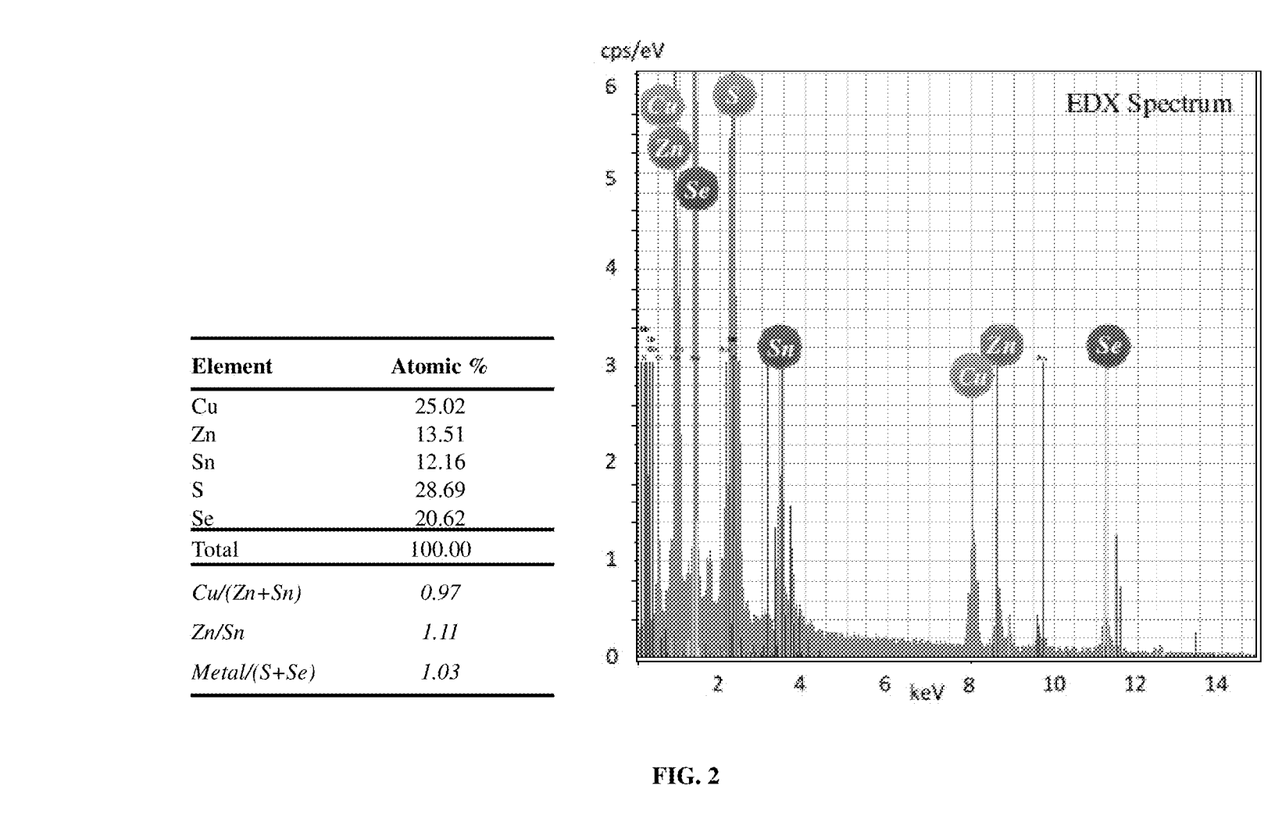
FIG. 2 is the composition of CZTS layer deduced from the EDX profile prepared from the electroplating process.
Figure 3:
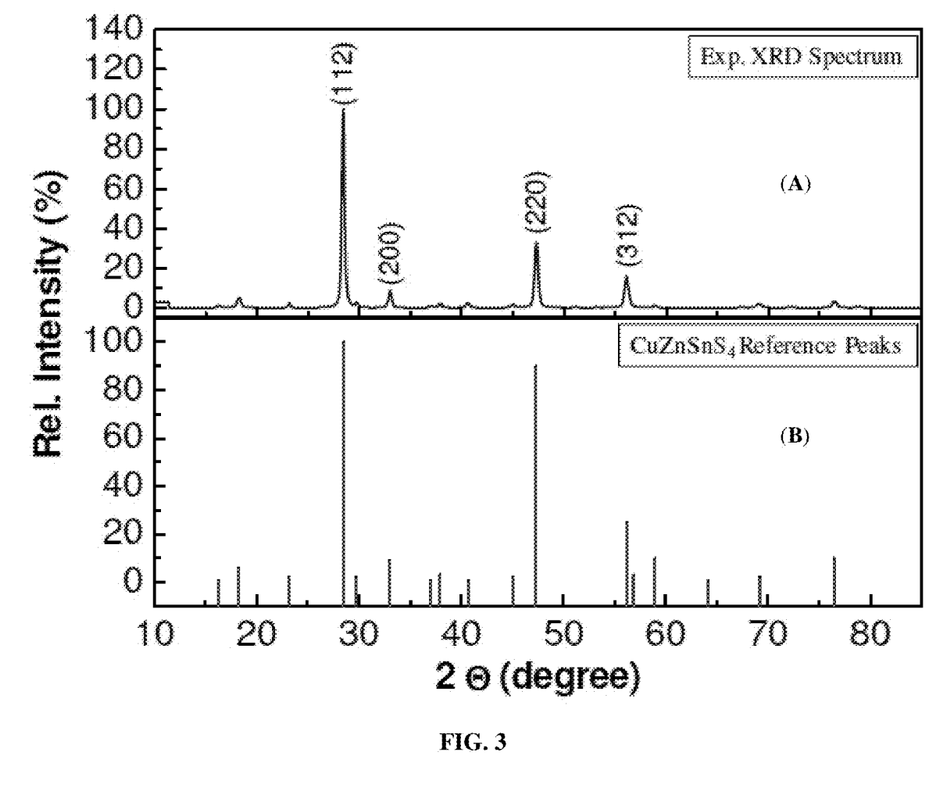
FIG. 3 is XRD results of CZTS layer prepared from the electroplating process: (A) XRD result of CZTS layer of the present invention; (B) Result from XRD database.

By using the electroplating-annealing route, the EDX result (FIG. 2) shows that the CZTS film can be deposited on a conductive substrate with the 2:1:1:4 atomic ratio, which is the same as the elemental ratio of CZTS empirical formula, i.e. $Cu_2ZnSn(S_ySe_{1-y})_4$. In terms of crystal structure and chemical composition, the resulting CZTS layer after annealing shows the same diffraction patterns in XRD as those of the CZTS absorption layer disclosed in the crystallography databases (FIG. 3). These results demonstrate the feasibility to transform the all-electroplated CZTS precursor stack into a light-absorbing CZTS layer.

EXAMPLES

Example 1

Formation of Cu—Zn—Sn Alloy by Single-Bath Formulation

In this example, a Cu—Zn—Sn alloy is prepared by a single-bath formulation containing a plating composition. An exemplary plating composition is provided in Table 1.

Besides the ionic compounds of copper, zinc and tin, the plating composition also includes salts of citrate to stabilize the plating solution and additives such as surfactant and aldehyde based compounds to reduce the surface roughness. Optimal range and examples of each component in the plating composition is set out in Table 1.

Citrate salts in the bath formulation according to Table 1 can be substituted by salts of dicarboxylate (e.g. oxalate, malonate, succinate), tricarboxylate (e.g. isocitrate, propane-1,2,3-tricarboxylate, benzene-1,3,5-tricarboxylate) and polycarboxylate-based polymers. The substitutes show similar chemical properties to citrate salts, i.e. they all bear carboxylate functional group and are possible candidates as the ligand to stabilize the plating bath and control the surface roughness as well as plating composition.

The plating composition prepared according to Table 1 then mixes well in water to form a single-bath formulation. It should be noted that they can be mixed outside the plating bath or inside the plating bath where the conductive substrate, molybdenum, is immersed to carry out the co-plating of copper, zinc and tin. The conductive substrate is connected to cathode in the plating bath while a counter electrode is connected to anode. Co-plating of copper, zinc and tin on the conductive substrate is carried out in the plating bath under the following conditions: pH 3 to 7; current density from 0.3 to 1 mA/cm$^2$; plating time: 10-60 minutes; temperature from 20° C. to 60° C. After that, an alloy of Cu—Zn—Sn with controllable atomic ratio is formed on the conductive substrate.

Example 2

Sequential Sulfurization and Selenization of Cu—Zn—Sn Alloy

An annealing step is required to transform a Cu—Zn—Sn alloy to CZTS light absorbing layer. Annealing conditions for sulfurization and selenization are illustrated in Table 2:

TABLE 2

|  | Parameters | Unit | Lower Limit | Upper Limit |
|---|---|---|---|---|
| Sulfurization | Temperature | ° C. | 350 | 600 |
|  | Duration | min | 30 | 200 |
|  | Ramp rate | ° C./min | 0.2 | 2 |
| Selenization | Temperature | ° C. | 300 | 550 |
|  | Duration | min | 2 | 30 |
|  | Ramp rate | ° C./min | 0.5 | 3 |

TABLE 1

|  |  | Plating parameter | Unit | Lower Limit | Upper Limit |
|---|---|---|---|---|---|
| Plating Composition | Main bath | Salts of Citrate (include sodium citrate, potassium citrate, mono-/di-/tri- basic) | mM | 100 | 500 |
|  |  | Cu salt (e.g. $CuCl_2$, $CuSO_4$, $Cu(NO_2)_2$) | mM | 10 | 50 |
|  |  | Sn salt (e.g. $SnCl_2$, $SnSO_4$, $Sn(NO_2)_2$) | mM | 5 | 40 |
|  |  | Zn salt (e.g. $ZnCl_2$, $ZnSO_4$, $Zn(NO_2)_2$) | mM | 50 | 300 |
|  | Additives | Surfactant (e.g. Sodium dodecyl sulfate (SDS), N,N-Dimethyl-N-dodecylglycine betaine (EMPIGEN ® BB), Polyethylene glycol (PEG)) | g/L | 1 | 10 |
|  |  | Aldehyde based compounds (e.g. propenal, aromatic aldehyde, benzaldehyde, formaldehyde) | g/L | 0.1 | 4 |

Figure 4:
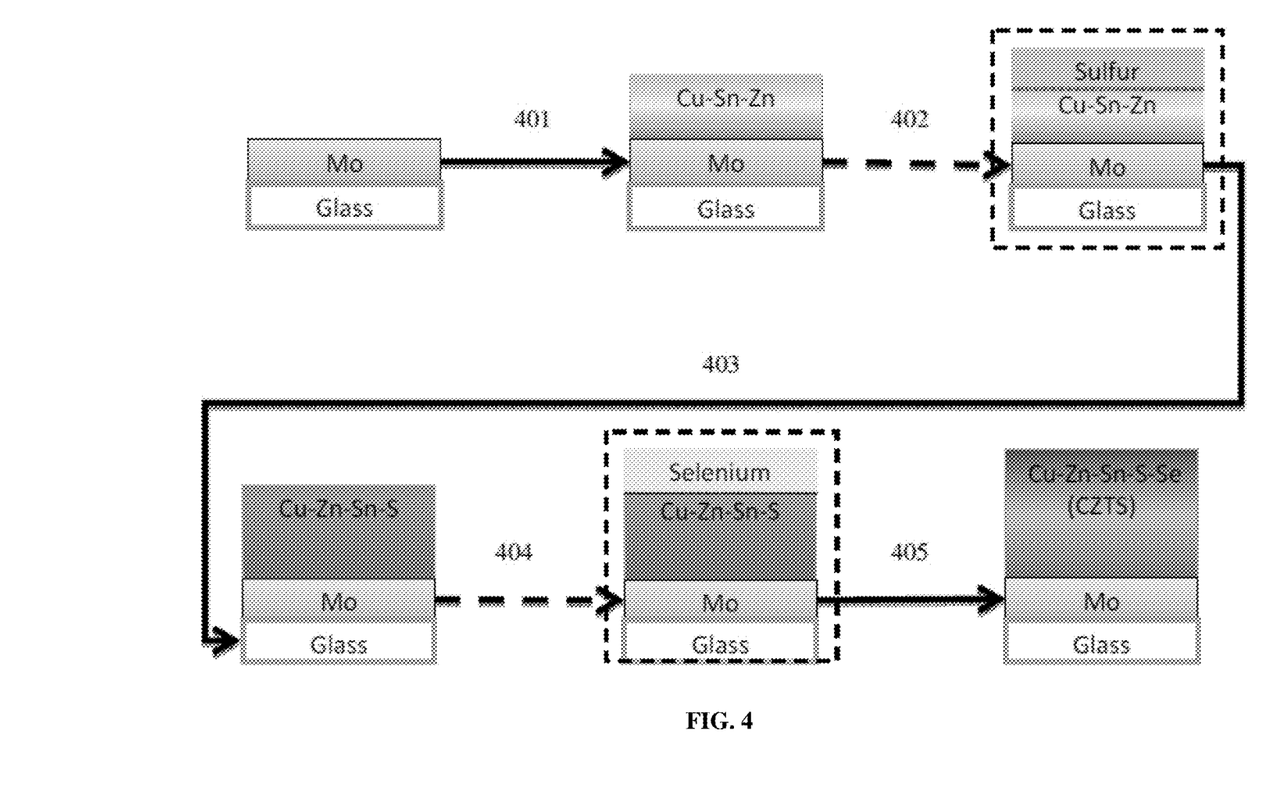
FIG. 4 is a schematic diagram of an embodiment of the CZTS semiconductor of the present invention prepared by co-plating of Cu—Zn—Sn alloy followed by sulfurization and selenization.
Figure 5:
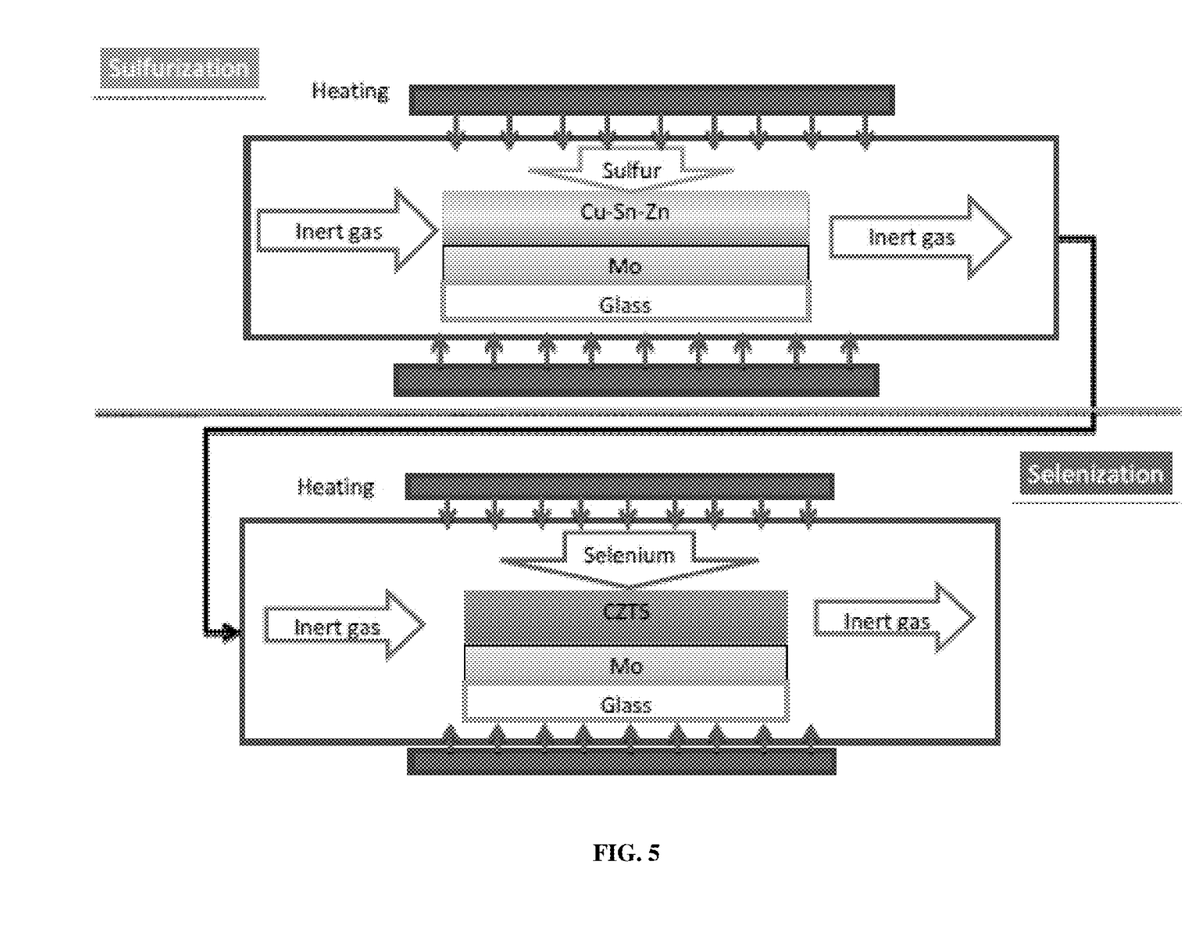
FIG. 5 is a schematic diagram of sequential sulfurization and selenization processes on the Cu—Zn—Sn alloy according to an embodiment of the present invention.

Flow diagram from formation of Cu—Zn—Sn alloy to annealing is shown in FIG. 4: 401: Formation of Cu—Zn—Sn alloy by co-plating of a single-bath formulation on molybdenum (Mo) substrate; 402: Formation of sulfur-rich atmosphere by using inert carrier gas flowing over sulfur; 403: Formation of Cu—Zn—Sn—S alloy after first annealing; 404: Formation of selenium-rich atmosphere by using inert carrier gas flowing over selenium; 405: Formation of Cu—Zn—Sn—S—Se alloy after second annealing. A schematic diagram summarizing the sequential sulfurization and selenization on the Cu—Zn—Sn alloy is shown in FIG. 5. This annealing sequence provides a method which does not require high temperature in selenization to avoid selenium attack to the substrate.

Example 3

Formation of Selenium Layer on Alloy Substrate

It is preferable to electroplate a selenium layer before annealing any alloy substrates under selenium-rich atmosphere. An exemplary plating composition for electroplating the selenium layer is provided in Table 3.

TABLE 3

| | | Plating parameter | Unit | Lower Limit | Upper Limit |
|---|---|---|---|---|---|
| Plating Composition | Main bath | Tetra-alkyl-quaternary ammonium salt (e.g. choline chloride, betaine, acetyl choline chloride, tetrabutylammonium chloride) | % | 20 | 60 |
| | | Selenium compounds (e.g. selenium tetrachloride, selenium dioxide, selenium sulfide, selenium oxychloride, selenous acid, and selenic acid) | mM | 5 | 100 |
| | Additives | Surfactant (e.g. Sodium dodecyl sulfate (SDS), N,N-Dimethyl-N-dodecylglycine betaine (EMPIGEN ® BB), Polyethylene glycol (PEG)) | g/L | 0.5 | 4 |
| | | Aldehyde based compounds (e.g. propenal, aromatic aldehyde, benzaldehyde, formaldehyde) | g/L | 0.5 | 2 |

A polar solvent containing one or more than one kind of tetra-alkyl-quaternary ammonium salt as the major component at 20-60% is provided. The tetra-alkyl-quaternary ammonium salt can be but not limited to choline chloride, acetyl choline chloride, and tetrabutylammonium chloride. The polar solvent can be but not limited to water, alcohol, carboxylic acid, amine, and amide. In addition, the plating composition comprises selenium compound as the selenium source, which includes one or more of selenium tetrachloride, selenium dioxide, selenium sulfide, selenium oxychloride, selenous acid, and selenic acid. Additives such as surfactant and aldehyde based compounds are also needed to improve film uniformity and adhesion. Optimal range and examples of each component in the plating composition is set out in Table 3.

The plating composition prepared according to Table 3 then mixes well in the polar solvent to form a bath formulation. The alloy substrate is connected to cathode in the plating bath while a counter electrode is connected to anode. The bath is kept under the following conditions: Temperature range at 60° C.-120° C., preferably higher than 70° C.; pH form 6 to 10, preferably high than 8; current density from 3 to 10 mA/cm². In an exemplary embodiment, the alloy substrate formed in Example 1 and further sulfurized in Example 2 is subject to the electroplating of the selenium layer according to this example using the plating composition as illustrated in Table 3 before the subsequent selenization by inert gas carrier flowing in Example 2. The method for forming selenium layer in this example can also be applied to other alloy substrates if possible.

Example 4

Figure 6:
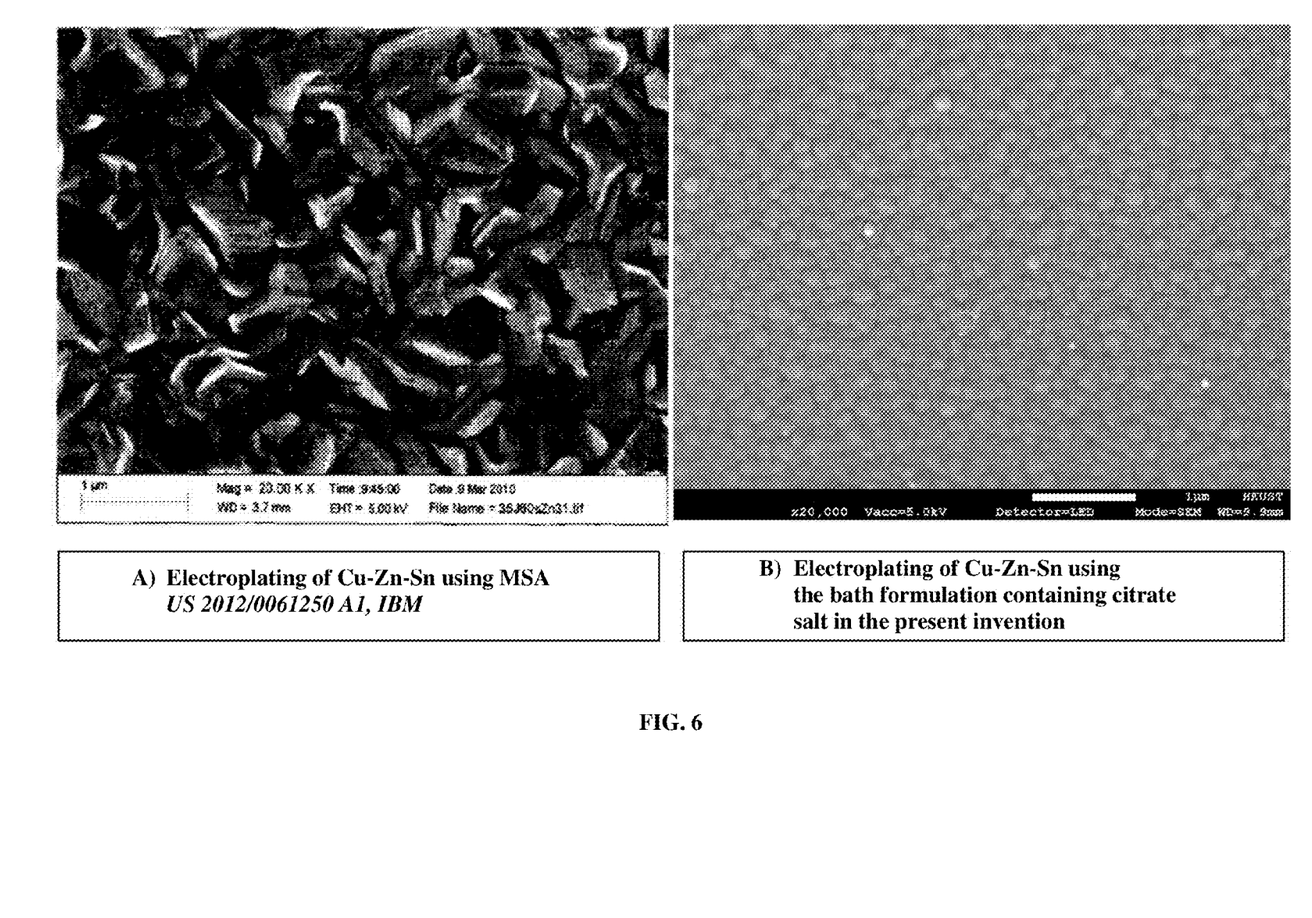
FIG. 6 is SEM photos showing (A) surface morphology and (B) cross section of a co-electroplated Cu—Zn—Sn alloy formed by the method according to one of the embodiments of the present invention.

Surface Morphology of Cu—Zn—Sn Alloy Prepared by Prior Art Method and Method of Present Invention FIG. 6 shows surface morphology difference between Cu—Zn—Sn alloy prepared according to the method disclosed in a patent art US20120061250A1 (FIG. 6A) and the method of the present invention (FIG. 6B). Methanesulfonic acid (MSA) is used in the electroplating solution of '250 while citric salt (e.g. citric acid) is used in the present invention. One of the advantages of using citric acid in the bath formulation for forming Cu—Zn—Sn alloy is to result in a smoother surface (lower roughness) than that formed by the electroplating solution containing MSA. Rough surface increases the risk of shorting. Also, using citric acid is more cost-effective than using MSA. Using the single-bath formulation containing the plating composition according to Table 1 and the co-plating conditions in Example 1, the resulting Cu—Zn—Sn alloy has a thickness ranging from 400 nm to 1,500 nm and a surface roughness less than 40 nm (rms).

Figure 7:
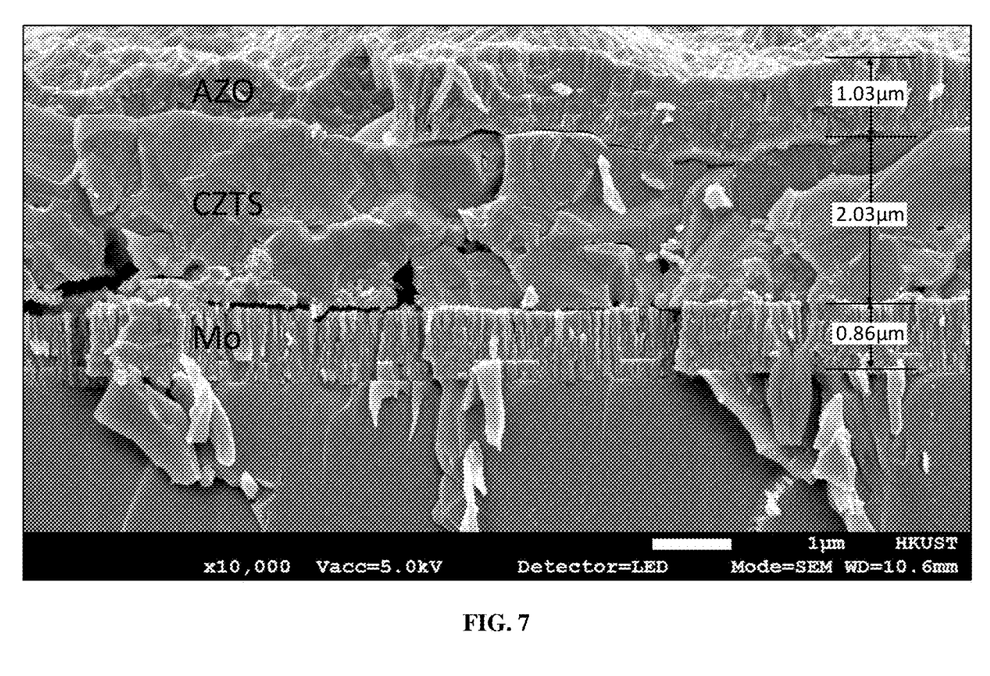
FIG. 7 is SEM photo showing layer morphology of a CZTS film prepared by a method according to an embodiment of the present invention and combined with an n-type semiconductor layer.

FIG. 7 shows the layer morphology of CZTS film prepared according to Examples 1 and 2 coated on a molybdenum substrate and further combined with CdS and AZO thin films to form a solar cell structure. The SEM photo in FIG. 7 shows that each layer is relatively uniform. In this specific sample, the thickness of the each layer is: molybdenum substrate: ~0.86 µm, CZTS layer: ~2.03 µm, CdS: <50 nm and AZO: ~1.03 µm. It should be noted that other n-type thin film such as Indium Tin Oxide (ITO) can also be combined with the CZTS film to form a solar cell or a solar cell structure. However, it is well known that AZO thin film is a standard material which makes the conductive layer of a solar cell transparent, and therefore AZO is a preferred material to be combined with the CZTS film in solar cell production.

Figure 8:
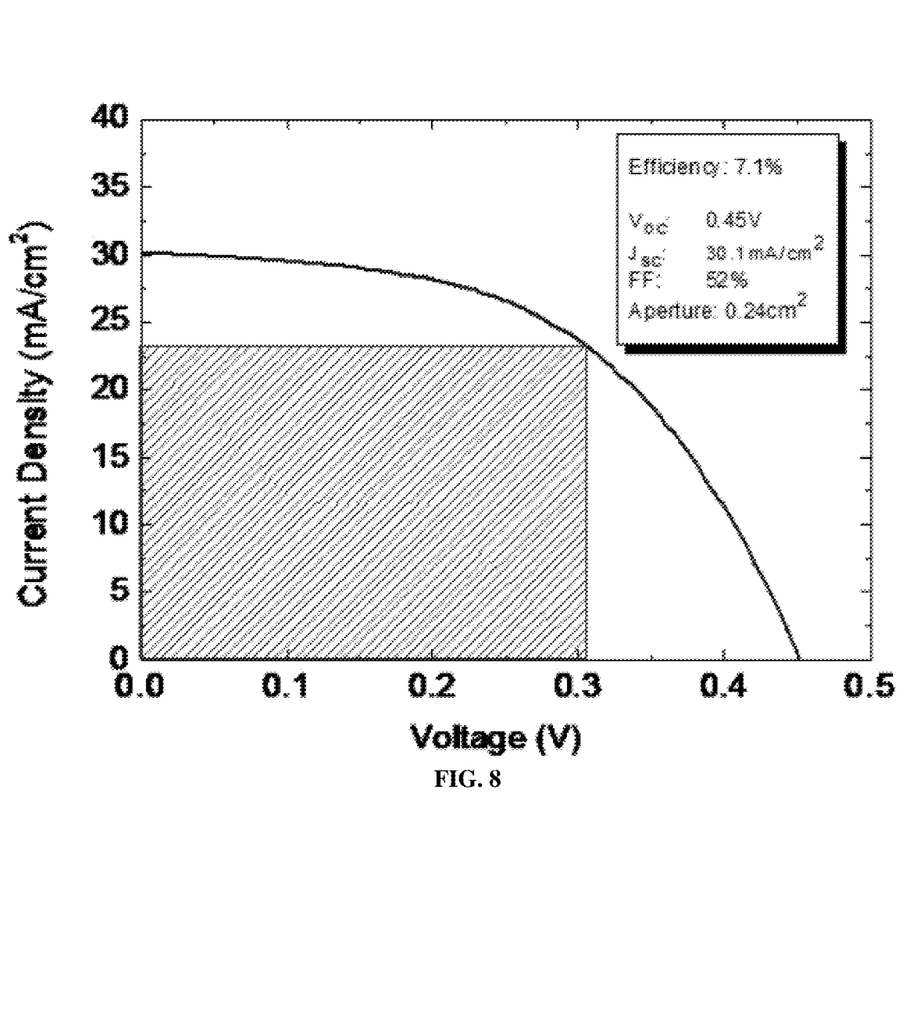
FIG. 8 is a plot of current density against voltage applied to the CZTS solar cell prepared by a method according to an embodiment of the present invention.

In order to show the potential of the CZTS film according to the present invention as an efficient light-absorbing material for solar cell, the conversion efficiency of the resulting CZTS solar cell as illustrated in FIG. 8 is determined from the measurement of the current density against voltage applied on the CZTS film prepared according to Examples 1 and 2. $V_{oc}$ stands for the open-circuit voltage (the maximum voltage available from the solar cell at zero current); FF is the fill factor of the solar cell; $J_{sc}$ is the short-circuit current density. The maximum power output is indicated by the shaded area in the plot and the efficiency can be determined by the ratio of the power output to the voltage applied. The conversion efficiency determined from the plot is 7.1% by using the CZTS alloy of the present invention, which is slightly lower than the efficiency of the CZTS solar cell prepared by a prior art method for Cu/Sn/Zn metal stack (Ahmed et al., "A High Efficiency Electrodeposited $Cu_2ZnSnS_4$ Solar Cell", *Advanced Energy Materials*, 2(2), 253-259, February 2012], which is 7.3%. However, the presently disclosed method is in lower cost, with a smoother surface morphology in the resulting Cu—Zn—Sn alloy or Cu/Zn/Sn metal stack, and a relatively more uniform layer structure.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes exemplary embodiments of the invention, these descriptions should not be viewed in a limiting sense. Rather, there are several variations and modifications which may be made without departing from the scope of the present invention as defined in the appended claims.

INDUSTRIAL APPLICABILITY

The method of the present invention can be used in solar cell industry to reduce cost and toxic substances during the preparation. The CZTS film prepared by the present method is also useful as the light absorbing material in combination with other standardized supporting structures for production of solar cell.

What is claimed is:

1. An electrochemical method for depositing a Cu—Zn—Sn alloy or a Cu/Zn/Sn metal stack on a conductive substrate comprising the following steps:
    a) providing an electrochemical cell containing a bath formulation and said conductive substrate;
    b) maintaining an electroplating bath temperature in a range of 20° C. to 60° C.;
    c) maintaining an electroplating bath acidity in a range of pH 3 to pH 7;
    d) applying a current to said electrochemical cell in a density range of 0.3 to 1 $mA/cm^2$,
    wherein said bath formulation comprises a solvent system that contains sodium and/or potassium salts of citrate mono-/di-/tri-basic or salts of dicarboxylate, tricarboxylate and polycarboxylate-based polymers having a concentration ranging from 100 mM to 500 mM; one or more ionic compounds of copper, zinc, and tin, said ionic compounds being salts of chloride, nitrate or sulfate and having a concentration ranging from 5 mM to 300 mM; and one or more surfactants and aldehydes, said surfactants comprising sodium dodecyl sulfate (SDS), N,N-dimethyl-N-dodecylglycine betaine and Polyethylene glycol (PEG), said aldehydes comprising propenal, aromatic aldehyde, benzaldehyde, formaldehyde, said surfactants and aldehydes having a concentration ranging from 0.1 mM to 10 mM; and
    wherein for depositing said Cu—Zn—Sn alloy, said one or more ionic compounds in said bath formulation is more than one of copper, zinc, and tin compounds, and said depositing is performed by co-plating of said bath formulation containing more than one ionic compounds on said conductive substrate in said single bath,
    wherein for depositing said Cu/Zn/Sn metal stack, said one or more ionic compounds in said bath formulation is one of the copper, zinc or tin compounds, and said depositing is performed layer-by-layer by repeating steps (a) to (d) in said electrochemical cell,
    and said method further comprising
    e) an annealing step for forming a layer of CZTSSe,
    said annealing step comprising:
        e1) using a first inert carrier gas flowing over sulfur to create sulfur-rich atmosphere for a first annealing on said Cu—Zn—Sn alloy or said Cu/Zn/Sn metal stack;
        e2) formation of Cu—Zn—Sn—S alloy after the first annealing;
        e3) formation of a selenium layer on said Cu—Zn—Sn—S alloy by plating of a second bath formulation;
        e4) using a second inert carrier gas flowing over selenium to create selenium-rich atmosphere for a second annealing on said Cu—Zn—Sn—S alloy after said selenium layer is formed in (e3); and
        e5) forming a layer of Cu—Zn—Sn—S—Se alloy after the second annealing.

2. The method of claim 1, wherein said conductive substrate comprises molybdenum, glass, plastic, stainless steel and aluminum.

3. The method of claim 1, wherein said second bath formulation comprises a polar solvent that contains one or more than one kind of tetra-alkyl-quaternary ammonium salt at 20-60%, one or more selenium compounds, and one or more surfactants and aldehydes; and
    wherein said tetra-alkyl-quaternary ammonium salt comprises choline chloride, betaine, acetyl choline chloride, and tetrabutylammonium chloride;
    said polar solvent comprises water, alcohol, carboxylic acid, amine, and amide;
    said selenium compounds comprise selenium tetrachloride, selenium dioxide, selenium sulfide, selenium oxychloride, selenous acid, and selenic acid, said selenium compounds having a concentration ranging from 5 mM to 100 mM; and
    said surfactants comprise sodium dodecyl sulfate (SDS) and Polyethylene glycol (PEG), said aldehydes comprise benzaldehyde and formaldehyde, said surfactants and aldehydes having a concentration ranging from 0.5 mM to 4 mM.

4. The method of claim 1, wherein said first and second annealing is performed at a temperature from 300° C. to 600° C. for 2 to 60 minutes under oxygen-free environment.

5. The method of claim 1, wherein said Cu—Zn—Sn alloy or said Cu/Zn/Sn metal stack is converted into a p-type semiconductor having a chemical formula of $Cu_2(Zn_xSn_{2-x})(S_ySe_{1-y})_4$ after said first and second annealing.

6. The method of claim 1, wherein the order of said first annealing under the sulfur-rich atmosphere and said second annealing under the selenium-rich atmosphere is reversible.

7. The method of claim 1, wherein said formation of the selenium layer on said Cu—Zn—Sn—S alloy is performed under the following conditions in a single bath of electrochemical cell containing said second bath formulation:
    a) maintaining an electroplating bath temperature in a range of 60° C. to 120° C.;
    b) maintaining an electroplating bath acidity in a range of pH 6 to pH 10; and
    c) applying an electrical potential to said electrochemical cell in a range of 3 to 10 $mA/cm^2$.

8. The method of claim 7, wherein said electroplating bath temperature is maintained at higher than 60° C. under an inert gas environment.

9. The method of claim 1, wherein said dicarboxylate salts comprising oxalate, malonate, and succinate; said tricarboxylate comprising isocitrate, propane-1,2,3-tricarboxylate, and benzene-1,3,5-tricarboxylate.

* * * * *